(12) United States Patent
Eide

(10) Patent No.: US 9,442,147 B2
(45) Date of Patent: Sep. 13, 2016

(54) METHOD AND DEVICE FOR CALIBRATING AN ANTENNA

(71) Applicant: Comrod AS, Tau (NO)

(72) Inventor: Jo Morten Eide, Stavanger (NO)

(73) Assignee: Comrod AS, Tau (NO)

( * ) Notice: Subject to any disclaimer, the term of this patent is extended or adjusted under 35 U.S.C. 154(b) by 502 days.

(21) Appl. No.: 13/743,158

(22) Filed: Jan. 16, 2013

(65) Prior Publication Data

US 2014/0198000 A1    Jul. 17, 2014

(51) Int. Cl.
*G01R 29/10* (2006.01)
*H01Q 3/00* (2006.01)

(52) U.S. Cl.
CPC ............... *G01R 29/10* (2013.01); *H01Q 3/00* (2013.01)

(58) Field of Classification Search
CPC .................................. H01Q 3/00; G01R 29/10
See application file for complete search history.

(56) References Cited

U.S. PATENT DOCUMENTS

| | | | |
|---|---|---|---|
| 4,011,512 A * | 3/1977 | Drury | 455/117 |
| 4,924,238 A | 5/1990 | Ploussios | |
| 2005/0088362 A1 * | 4/2005 | Lin et al. | 343/876 |

* cited by examiner

*Primary Examiner* — Hoang V Nguyen
*Assistant Examiner* — Michael Bouizza
(74) *Attorney, Agent, or Firm* — Andrus Intellectual Property Law, LLP

(57) ABSTRACT

A method and device are for calibrating an antenna. At least one switch is spanning sections of a radiating antenna element. A controller is designed to selectively close the switch to be conductive, thus effectively short-circuiting the actual section of the antenna element. The method includes: installing the antenna for field use at least for transmission or reception of signals; then measuring the reflected power from the antenna at least for a number of frequencies or frequency ranges at more than one setting of the switch; and storing the settings that gives a desirable result of reflected power at an actual frequency or frequency range.

9 Claims, 2 Drawing Sheets

METHOD AND DEVICE FOR CALIBRATING AN ANTENNA

BACKGROUND

There is provided a method for calibrating an antenna. More precisely there is provided a method for calibrating an antenna where at least one switch is spanning sections of a radiating antenna element, and where a controller is designed to selectively close the switch, thus effectively short-circuiting the actual section of the radiating antenna element. The invention also includes a device for calibrating an antenna.

Resonant antennas having one or more radiating elements may be tuned to work over a broad range of frequencies by short-circuiting at least a section of the radiating antenna element. The short-circuiting may be performed by the use of a mechanically operated or semiconductor based switch.

It is well known technique to use so called PIN diodes for this purpose. The PIN diode is chosen due to the fact that it has a poor reverse recovery time and will stay open at high frequencies.

In U.S. Pat. No. 4,924,238, Ploussios outlines a resonant helical electronically tuned antenna. The antenna is tuned by a series of oppositely poled pairs of diodes that are connected at spaced points to the radiating coils of the antenna. When the diodes are biased to be conductive, a section of the radiating helix is short-circuited. Bias voltages to control the diodes are provided by a bias voltage generator. See FIG. 1.

The bias voltage generator may be programmed to produce a voltage for a specific pair of diodes when the antenna is transmitting or receiving signals at a specific frequency range. The control of the biasing voltage generator may include a factory made table that states which diodes to bias at which voltage range. The factory calibration process may take some time.

Experience has shown that great production and component precision is necessary if antennas of this kind are to be calibrated at the factory. Further the topography and local conditions at the position of installation are known to greatly influence the way the antenna behaves. It is also influenced by the ambient temperature and ageing.

SUMMARY

The purpose of the invention is to overcome or reduce at least one of the disadvantages of the prior art.

The purpose is achieved according to the invention by the features as disclosed in the description below and in the following patent claims.

According to a first aspect of the invention there is provided a method for calibrating an antenna where at least one switch is spanning sections of a radiating antenna element, and where a controller is designed to selectively close the switch, thus effectively short-circuiting the actual section of the antenna element wherein the method includes:
  installing the antenna for field use at least for transmission or reception of signals;
  then measuring the reflected power from the antenna at least for a number of frequencies or frequency ranges at more than one setting of the switch; and
  storing the settings that gives a desirable result of reflected power at an actual frequency or frequency range.

A lower value of reflected power indicates that a larger part of the power is transmitted.

In a preferred embodiment the switch is in the form of biasable opposite poled pair of diodes where so called PIN diodes have proved to work satisfactory.

The biasable pairs of diodes will, when biased by a voltage from the controller, remain open as long as the biasing voltage is present.

The method may include measuring the transmission or receiving frequency and set the at least one switch according to the stored setting.

When the measurement of the reflected power is done after the antenna is installed for use, variables such as component accuracy, build accuracy, topographical and local conditions as well as ambient temperature and ageing of the antenna are taken into account. Consequently, a much improved antenna calibration is achieved.

The method may include:
  providing a signal generator that is controlled by the controller and designed to send radio frequency signals to the antenna;
  providing a directional coupler at the antenna that is connected to the controller; and
  measuring the reflected power from the antenna at the directional coupler for a frequency or frequency range produced by the signal generator.

Signal generators and directional couplers are well known components to a skilled person working with antennas.

The method may include:
  letting the controller select a frequency at the signal generator;
  letting the controller select a setting of at least the switch; and
  measuring and storing the value of reflected power at that frequency and setting.

The method may include repeating the procedure for a number of frequencies or frequency ranges.

The method may include comparing the results for selecting the setting that gives the most desirable result at the actual frequency or frequency range.

There may be two or more settings of two or more switches that give reasonably good results at a specific frequency or frequency range. The controller may choose the setting that gives the most desirable result.

The method may include making a table of the settings that gives the most desirable results at more than one frequency or frequency range.

A table of the most desirable or best settings at each frequency or frequency range is thus present in the controller or another storage device that has communication with the controller.

The method may include letting the controller, during operation of the antenna, measure the actual transmission or receiving frequency or frequency range, or receive said information from a radio, and selecting a setting of the at least one switch from the table.

As the table of preferred settings is available with the desired settings, the biasing of the actual switch or switches at the actual frequency or frequency range may be done almost instantaneously when a certain frequency is detected at the antenna.

The method may include providing the controller with computing hardware and software for performing the method.

Present hardware and software are sufficiently fast to perform the necessary operation also for antennas that are designed to work with radios that often changes frequency such as frequency-hopping spread spectrum radios (FHSS).

Although all the controlling functions here are included in the controller, other layouts where one or more of the included functions are placed at other components, may function just as well.

According to a second aspect of the invention there is provided a device for calibrating an antenna where at least one switch is spanning sections of a radiating antenna element, and where a controller is designed to selectively close the at least one switch, thus effectively short-circuiting the actual section of the antenna element wherein a signal generator that is designed to supply the antenna with radio frequency signals is connected to the controller, and where a directional coupler that is designed to measure the reflected power from the antenna, is connected to the controller.

The signal generator of the device, when controlled by the controller, may be designed to send a radio frequency signal to the antenna and the directional coupler may be designed to measure the reflected power from the antenna at said frequency and transmit the result to the controller, and where the controller stores the value of reflected power from the antenna at the actual frequency.

The controller may store the value of reflected power at more than one setting of the switches for each frequency or range of frequencies.

The settings may be stored in a table where the values are erased when a new calibration is performed.

It is essential that the calibration is performed after the antenna is installed for field use, and not as part of the production process.

The controller may be equipped with computing hardware and software for performing the measurement.

The controller may be equipped with computing hardware and software for choosing the appropriate setting of the at least one switch for an actual frequency.

The method and device according to the invention are particularly well suited for use on rod antennas designed for vehicular or marine use. Also fixed positions antennas may benefit from the invention.

Rather substantial improvement in antenna efficiency has been experienced by utilizing the method and device as outlined in the present document. It is obvious that an antenna that is frequently moved between different locations where topography and local condition may differ, will benefit from this invention.

BRIEF DESCRIPTION OF THE DRAWINGS

Below, an example of a preferred method and device are explained under reference to the enclosed drawings, where.

DETAILED DESCRIPTION OF THE DRAWINGS

Figure 1:
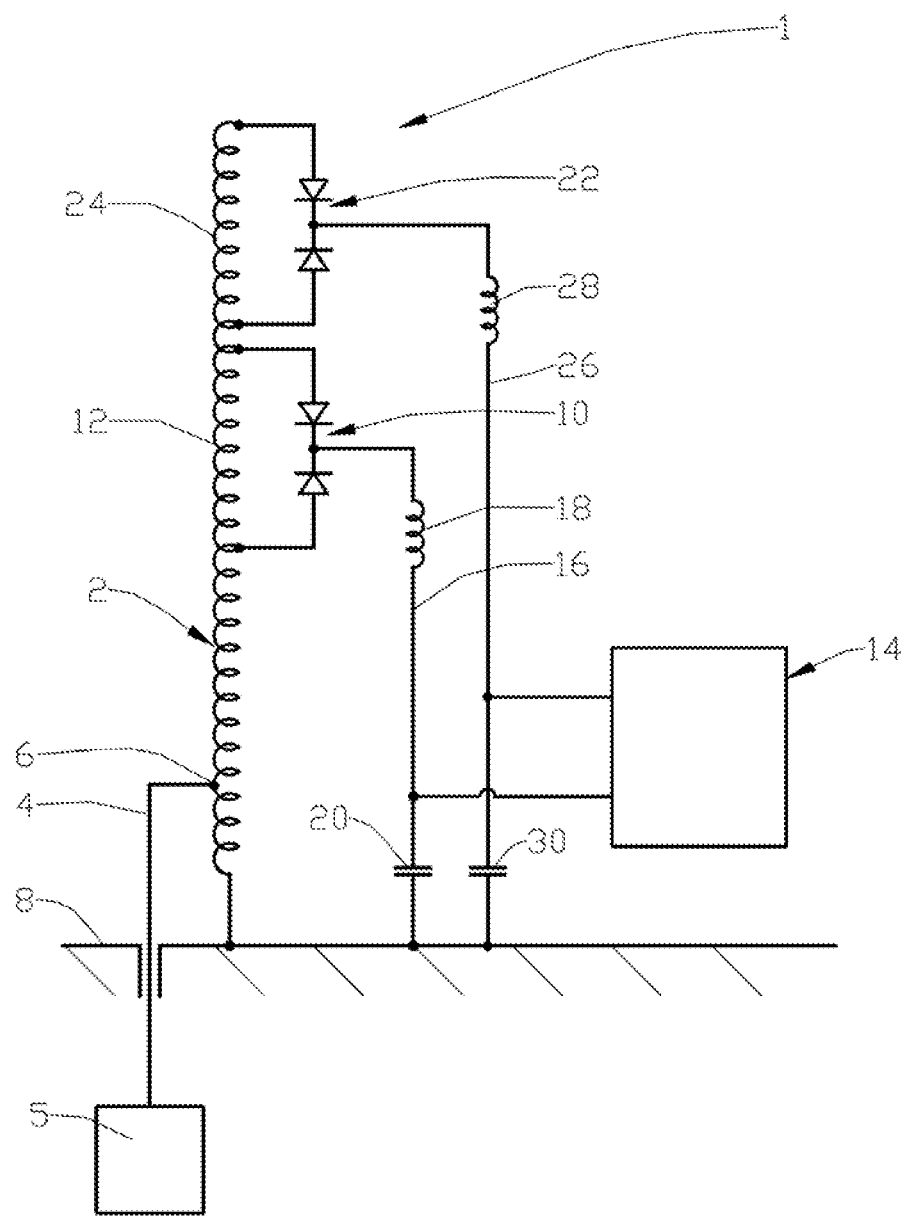
FIG. 1 shows a prior art PIN diode controlled antenna.

On the drawings the reference number 1 denotes a switch controlled antenna that is termed "antenna" in this document. The antenna 1 includes a radiating antenna element 2 that has a connecting line 4 to a radio 5 connected at a line connection 6. The antenna element 2 is connected to a ground plane 8.

A first switch 10, here in the form of a pair of opposite poled so called PIN diodes, is connected across a first section 12 of the radiating element 2. Biasing voltage for the first switch 10 is supplied from a controller 14 through a first biasing line 16 through a first choke 18 to similar elements (cathodes) of the diode pair of the first switch 10. A first capacitor 20 is connected between the first choke 18 and the ground plane 8.

Similarly, a second switch 22, also on the form of a pair of opposite poled PIN diodes, is connected across a second section 24 of the antenna element 2. A second biasing line 26 is connected between the controller 14 through a second choke 28 to similar elements of the diode pair of the second switch 22. A second capacitor 30 is connected between the second choke 28 and the ground plane 8.

When a biasing voltage is supplied from the controller 14 to the first switch 10, due to the characteristics of the PIN diodes, the pair of diodes of the first switch 10 will remain open in both directions as long as the biasing voltage is present. The pair of diodes of the first switch 10 will effectively short circuit the first section 12 of the antenna element 2, thus changing the resonant frequency of the antenna element 2.

A biasing voltage supplied to the diode pair of the second switch 22 will short circuit the second section 24 of the antenna element 2.

The operation of a prior art PIN diode controlled antenna is explained in more detail in U.S. Pat. No. 4,924,238 that is mentioned in the preamble of this document.

Figure 2:
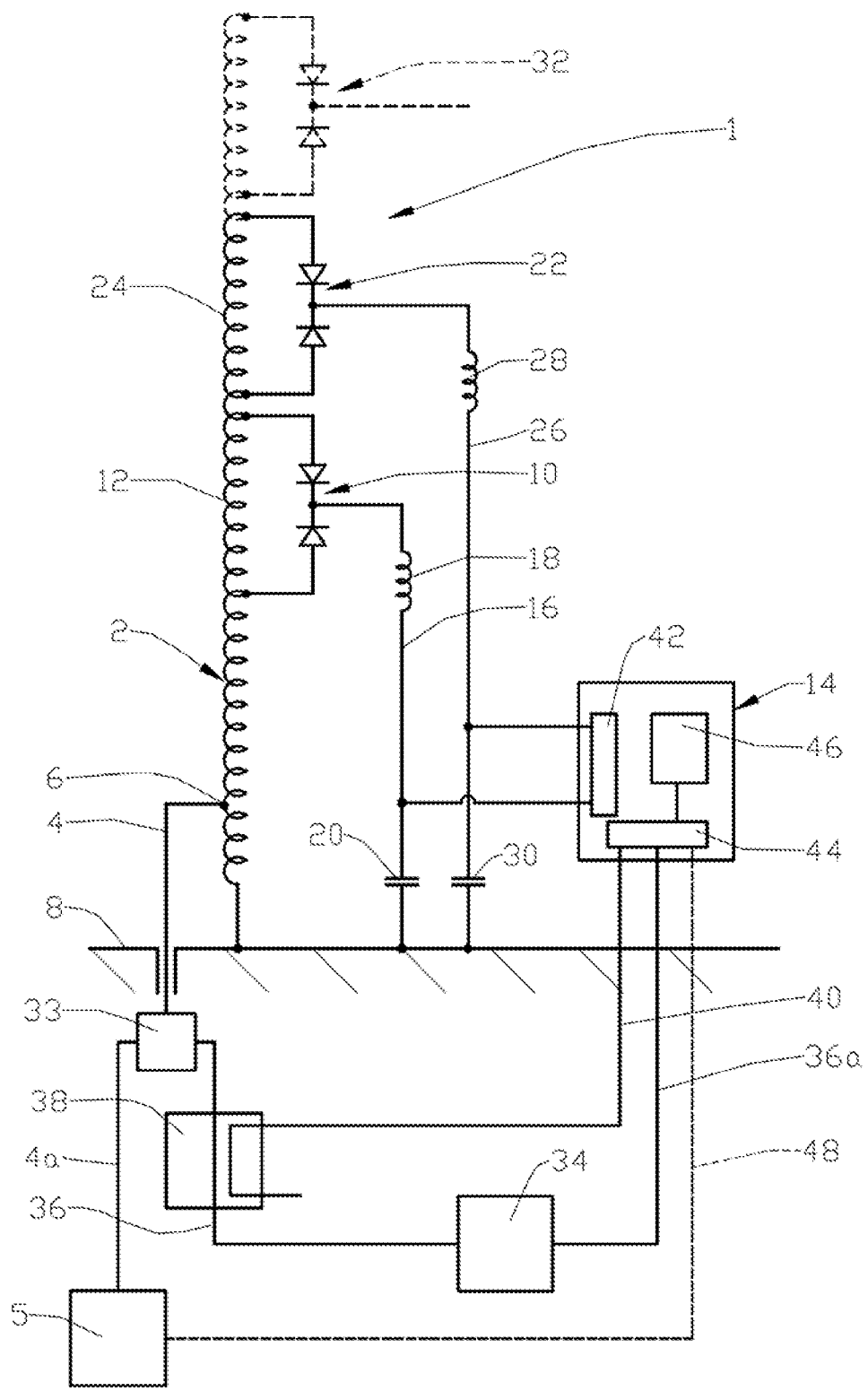
FIG. 2 shows a switch controlled antenna having calibration equipment according to the present invention.

Now referring to FIG. 2, a dotted third switch 32 indicates that one or more not shown additional switches may be present.

Here, the connection line 4 is connected to the radio 5 via a selector 33 and a line 4a. A signal generator 34 is also connected to the connection line 4 via the selector 33 via a line 36. The signal generator 34 is designed to produce radio frequency signals to the antenna element 2. The signal generator 34 receives information from the controller 14 through a control line 36a of which frequency to produce.

A directional coupler 38 is designed to read the reflected power from antenna element 2. Information about the actual reflected power is supplied from the directional coupler 38 and to the controller 14 through a coupler line 40.

According to this preferred embodiment the controller 14 includes a main switch 42 that is designed to switch the biasing voltage to the diode pairs of the switches 10, 22, 32 on and of. The controller 14 further includes calculating hardware 44 with appropriate software and is designed to control among other features known to a skilled person, the main switch 42 and the signal generator 34.

In a first mode of operation, after the antenna 1 has been installed, and preferable every time the antenna 1 is switched on, the software is initiating a calibration operation.

The calibration operation includes that after the selector has connected the line 36 to the connection line 4, the controller 14 control the signal generator 34 to produce signal at a first predefined frequency that is supplied to the antenna element 2. At this frequency the diode pairs of the different switches 10, 22, 32 or combinations of switches 10, 22, 32 are biased, giving different settings, and the reflected power measured and stored for each setting. The setting giving the lowest reflected power will generally be chosen to be stored in a table 46.

In some cases two or more settings may give more or less equal results. Then the setting giving good results on the widest frequency range may be selected for the table 46.

The above procedure is repeated for a number of pre-defined frequencies and the table 46 filled in with values representing the preferred setting at each frequency or frequency range.

In a second mode of operation, after the selector 33 has connected the line 4a to the connection line 4 and when the antenna 1 is in use, the controller 14 will bias the diode pairs of the appropriate switches 10, 22, 32 based on the actual frequency at the antenna element 2 and the corresponding value in the table 46. The actual frequency at the antenna element 2 may be measured locally or the information supplied by the radio 5, here illustrated by a dotted line 48.

What is claimed is:

1. A method for in-field calibration of an antenna at a location of use and separate from an antenna production process where at least one switch is spanning a section of a radiating antenna element, and where a controller is designed to selectively close the switch, thus effectively short-circuiting an actual section of the antenna element, the method comprising:
    installing the antenna for field use at least for transmission or reception of signals;
    then measuring reflected power from the antenna after the field installation thereof at least for a number of frequencies or frequency ranges at more than one setting of the switch; and
    storing the settings that give the lowest reflected power at an actual frequency or frequency range.

2. A method according to claim 1 wherein the method comprises measuring the transmission or receiving frequency and setting the switch according to the stored setting.

3. A method according to claim 1 wherein the method comprises:
    providing a signal generator that is controlled by the controller and designed to send radio frequency signals to the antenna;
    providing a directional coupler at the antenna that is connected to the controller; and
    measuring the reflected power from the antenna at the directional coupler for a frequency or frequency range produced by the signal generator.

4. A method according to claim 3 wherein the method comprises:
    letting the controller select a frequency at the signal generator;
    letting the controller select a setting of at least the switch; and
    measuring and storing a value of the reflected power at that frequency and setting.

5. A method according to claim 4 wherein the method comprises repeating the procedure for a number of frequencies or frequency ranges.

6. A method according to claim 5 wherein the method comprises comparing the results for selecting the setting that gives the lowest reflected power at the actual frequency or frequency range.

7. A method according to claim 6 wherein the method comprises making a table of the settings that gives the lowest reflected power at more than one frequency or frequency range.

8. A method according to claim 7 wherein the method comprises letting the controller measure the actual transmission or receiving frequency or frequency range, or receive said information from a radio, and selecting a setting of the at least one switch from the table.

9. A method according to claim 1 wherein the method comprises providing the controller with computing hardware and software for performing the method.

\* \* \* \* \*